(12) United States Patent
Godet et al.

(10) Patent No.: US 8,974,683 B2
(45) Date of Patent: *Mar. 10, 2015

(54) METHOD AND SYSTEM FOR MODIFYING RESIST OPENINGS USING MULTIPLE ANGLED IONS

(75) Inventors: Ludovic Godet, Boston, MA (US);
Patrick M. Martin, Ipswich, MA (US);
Joseph C. Olson, Beverly, MA (US);
Andrew J. Hornak, York, ME (US)

(73) Assignee: Varian Semiconductor Equipment Associates, Inc.

( * ) Notice: Subject to any disclaimer, the term of this patent is extended or adjusted under 35 U.S.C. 154(b) by 591 days.

This patent is subject to a terminal disclaimer.

(21) Appl. No.: 13/228,625

(22) Filed: Sep. 9, 2011

(65) Prior Publication Data
US 2013/0062309 A1 Mar. 14, 2013

(51) Int. Cl.
*H01L 21/302* (2006.01)
*H01L 21/027* (2006.01)
*H01J 37/32* (2006.01)
*G03F 7/40* (2006.01)

(52) U.S. Cl.
CPC ....... *H01L 21/0273* (2013.01); *H01J 37/32422* (2013.01); *G03F 7/40* (2013.01)
USPC .............. 216/62; 216/41; 216/49; 216/67; 438/710; 438/725; 438/731; 430/328; 430/394

(58) Field of Classification Search
None
See application file for complete search history.

(56) References Cited

U.S. PATENT DOCUMENTS

| 5,876,903 | A  | * | 3/1999 | Ng et al. | 430/313 |
| 6,200,903 | B1 | * | 3/2001 | Oh et al. | 438/705 |
| 6,527,911 | B1 | * | 3/2003 | Yen et al. | 156/345.43 |
| 7,767,977 | B1 | * | 8/2010 | Godet et al. | 250/423 R |
| 8,101,510 | B2 | * | 1/2012 | Godet et al. | 438/513 |
| 8,133,804 | B1 | * | 3/2012 | Godet et al. | 438/525 |
| 8,188,445 | B2 | * | 5/2012 | Godet et al. | 250/423 R |
| 8,354,655 | B2 | * | 1/2013 | Godet et al. | 250/492.23 |
| 8,435,727 | B2 | * | 5/2013 | Godet et al. | 430/322 |
| 8,460,569 | B2 | * | 6/2013 | Godet et al. | 216/87 |
| 8,664,098 | B2 | * | 3/2014 | Godet et al. | 438/513 |
| 2011/0223546 | A1 | * | 9/2011 | Godet et al. | 430/325 |
| 2012/0228515 | A1 | * | 9/2012 | Leavitt et al. | 250/396 R |

* cited by examiner

*Primary Examiner* — Anita Alanko

(57) ABSTRACT

A method of reducing roughness in an opening in a surface of a resist material disposed on a substrate, comprises generating a plasma having a plasma sheath and ions therein. The method also includes modifying a shape of a boundary defined between the plasma and the plasma sheath with a plasma sheath modifier so that a portion of the boundary facing the resist material is not parallel to a plane defined by the surface of the substrate. The method also includes providing a first exposure of ions while the substrate is in a first position, the first exposure comprising ions accelerated across the boundary having the modified shape toward the resist material over an angular range with respect to the surface of the substrate.

15 Claims, 13 Drawing Sheets

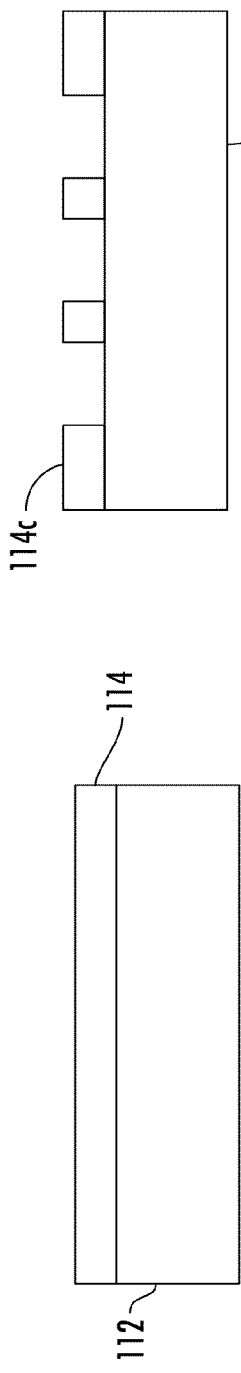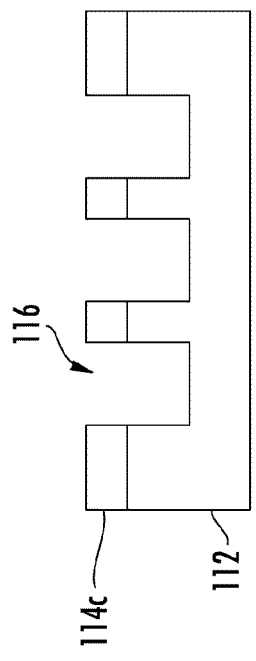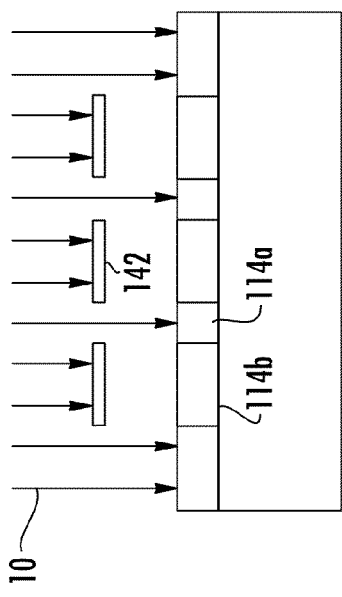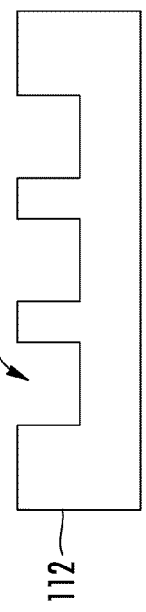
FIG. 1A
FIG. 1B
FIG. 1C
FIG. 1D
FIG. 1E
(PRIOR ART)

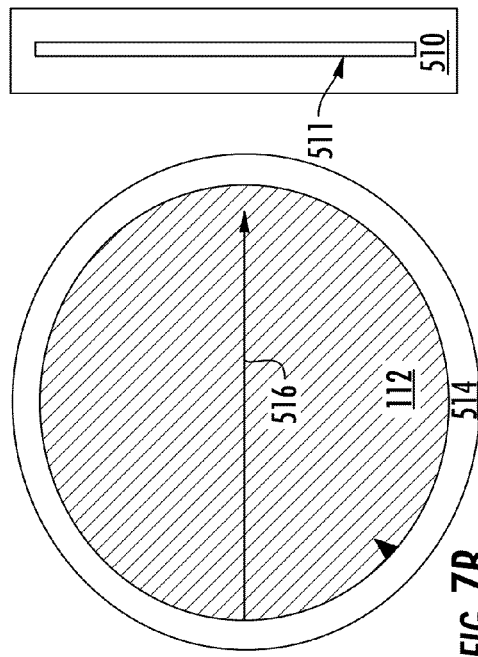
FIG. 7A
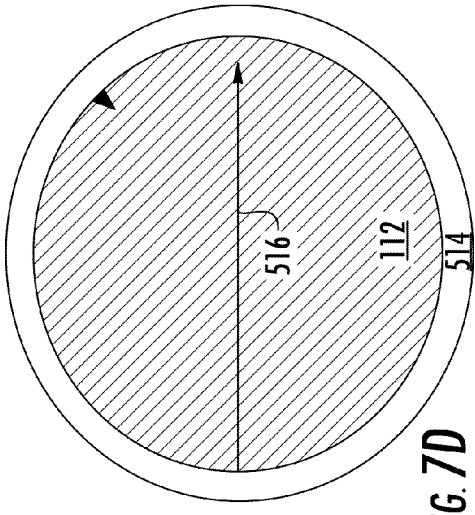
FIG. 7B
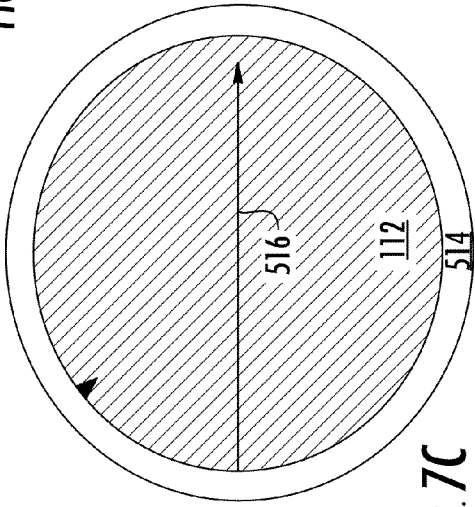
FIG. 7C
FIG. 7D

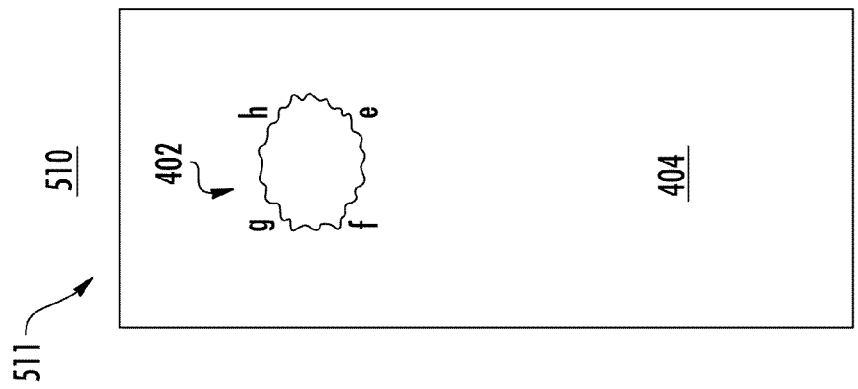
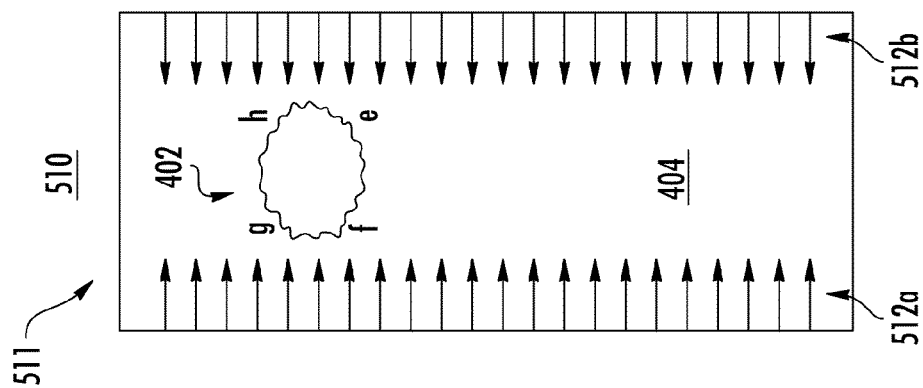
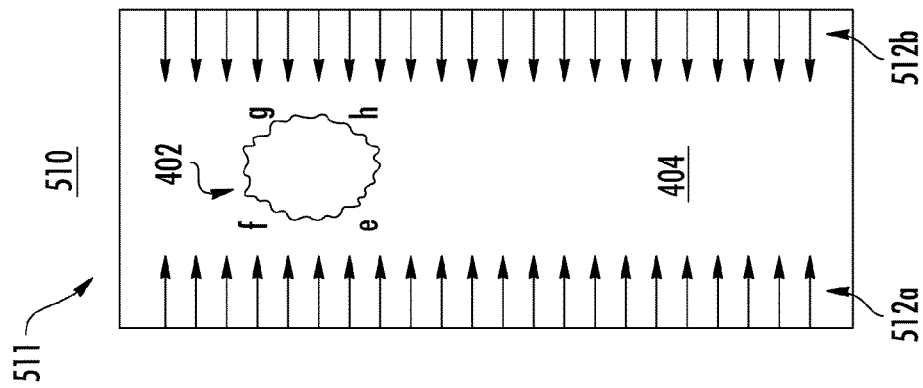

METHOD AND SYSTEM FOR MODIFYING RESIST OPENINGS USING MULTIPLE ANGLED IONS

BACKGROUND OF THE INVENTION

1. Field of the Invention

Embodiments of the invention relate to the field of device manufacturing. More particularly, the present invention relates to a method, system and structure for patterning a substrate and for implanting into a substrate for manufacturing a device.

2. Discussion of Related Art

Optical lithography is often used in manufacturing electronic devices. It is a process by which a substrate is patterned so that circuit may be formed on the substrate according to the pattern. Referring to FIG. 1a-1e, there are shown simplified illustrations of the optical lithographic process. Generally, the substrate 112 is coated with photo-curable, polymeric photoresist 114 (FIG. 1a). Thereafter, a mask 142 having a desired aperture pattern is disposed between the substrate 112 and a light source (not shown). The light 10 from the light source is illuminated onto the substrate 112 via the aperture of the mask 142, and the light transmitted through the mask's aperture (or the image of the pattern) is projected onto the photoresist 114. A portion of the photoresist is exposed to the light 10 and cured, forming cured photoresist portion 114a, whereas the rest of the photoresist remains uncured, as illustrated by uncured photoresist 114b (FIG. 1b). As a result, an image of the mask's aperture may be formed by the cured photoresist portion 114a.

As illustrated in FIG. 1c, the uncured photoresist 114b is stripped, and 3D photoresist feature or relief 114c corresponding to the mask's aperture pattern may remain on the substrate 112. Thereafter, the substrate is etched, and trenches 116 corresponding to the negative image of the mask's aperture pattern may form (FIG. 1d). After the uncured photoresist 114b is removed, a patterned substrate 112 may form (FIG. 1e). If a metallic layer is deposited on the trenches, a circuit having a desired pattern may be formed on the substrate 112.

Referring to FIG. 2, there is shown a conventional optical lithographic system 200 for projecting the image of the mask's aperture pattern to the substrate. The optical lithography system 200 comprises a light source 222, an optical integrator 232, and a condenser lens 234. In addition, the optical lithography system 200 comprises mask 142 having a desired aperture pattern and a projection lens 252. As illustrated in the figure, light having desired wavelength is emitted from the light source 222 to the optical integrator 232 and the condenser lens 234, which are collectively known as an illuminator 230. In the illuminator 230, the light 10 is expanded, homogenized, condensed, or otherwise conditioned. The light 10 is then illuminated onto the mask 142 having the desired aperture pattern to be projected onto the substrate 112. The light 10 transmitted through the apertures of the mask 142 may contain the information on the mask's aperture pattern. The light 10 is then captured by the projection lens 252 which projects the light 10 or the image of the mask's aperture pattern onto the photoresist deposited on the substrate 112. In projecting the image, the projection lens 10 may reduce the image by a factor of four or five.

To generate circuit patterns with smaller feature size (e.g. width of the trench), several modifications have been implemented into the process. As known in the art, the ability to project a clear image of a small feature may depend on, among others, the wavelength of the light used in the process. Currently, ultraviolet (UV) light with wavelengths of 365 nm and 248 nm, and 193 nm are used.

Although optical lithography is an efficient process with high throughput, the process is not without disadvantages. One limitation is the inability to print accurate openings or holes within a resist material as the opening size scales smaller. As the opening dimension scales to smaller dimensions, the lithography system loses imaging resolution. Additionally, during the development and removal stages, less material may be removed in lower portions of a three dimensional opening in resist, as illustrated in FIGS. 1f-1h. As depicted in FIGS. 1f-1g, the resist layer 160 includes multiple circular openings 164 which are tapered such that the dimension is smaller at the substrate interface. After substrate etching, this may lead to smaller than desired vias 166 in the underlying substrate 162, as shown in FIG. 1h. In addition, resist residue may remain at the interface between the circular opening 164 and substrate 162, preventing proper etching of the underlying substrate 162 in subsequent processing steps so that non-uniform substrate vias 166 form.

A further problem is illustrated in FIG. 1i, in which openings 172 are formed in resist 170. FIG. 1i depicts rough and irregularly shaped openings 172, which are typical of very small resist openings. As opening dimension shrinks, particularly below about 100 nm, roughness associated with the opening may be a significant fraction of the total nominal size of the opening, as depicted. The roughness of small features is known as line width roughness (LWR) or line edge roughness (LER) in the context of printed resist features, such as lines, and is used hereinafter also to refer to roughness characteristics in resist openings. As known in the art, LWR is excessive variations in the width of the photoresist feature formed after uncured photoresist 114b is stripped from the substrate. If the variations occur on the side surface of the photoresist relief or feature, the variations is known as LER. Because the geometrical shape of a patterned resist feature such as a rough opening is transferred from a resist layer to an underlying permanent layer of a device during patterning of the underlying layer, LWR and LER can limit the ability to form trenches or vias of acceptable quality for small opening dimensions, such as those below about 100 nm in lateral size. Such variations may lead to non-uniform circuits and ultimately device degradation or failure.

Several approaches have been proposed to address the printing of small openings in resist. One technique involves printing relatively larger openings in a resist material, followed by introducing chemicals into the resist to swell the resist and thereby shrink the size of the opening. Other known techniques, including shrink assist film for enhanced resolution (SAFIER™), and cross contact double patterning, are complex and involve multiple steps to implement.

In view of the above, it will be appreciated that there is a need to improve resist lithography processes for technologies requiring very small opening sizes, such as for sub-100 nm CD devices.

SUMMARY OF THE INVENTION

Embodiments of the present invention are directed to methods and systems for improving patterning a substrate, in particular, by improving patterning in a set of resist features used to pattern an underlying substrate. In an exemplary embodiment, a method of reducing roughness in an opening of a resist material disposed on a substrate, comprises generating a plasma having a plasma sheath and ions therein. The method also includes modifying a shape of a boundary defined between the plasma and the plasma sheath with a plasma sheath modifier so that a portion of the boundary facing the resist material is not parallel to a plane defined by the surface of the substrate. The method also includes providing a first exposure of ions while the substrate is in a first position, the first exposure comprising ions accelerated across the boundary having the modified shape toward the resist material over an angular range with respect to the surface of the substrate.

In another embodiment, a system for reducing roughness in an opening of a resist layer disposed on a substrate comprises a plasma source configured to generate a plasma having a plasma sheath and an extraction plate disposed between the plasma and the substrate. The extraction plate is configured to control a shape of a boundary defined between the plasma and the plasma sheath such that a portion of the shape of the boundary is not parallel to a plane defined by a surface of the substrate, said surface facing the plasma. The system also includes a substrate holder, wherein, when a voltage is applied between the plasma and substrate holder ions extracted from the plasma through the extraction plate are incident on the substrate over a range of angles defined with respect to the plane. The system is also configured to provide ions that are incident on the substrate over a range of twist angles defined with respect to a normal to the plane.

BRIEF DESCRIPTION OF THE DRAWINGS

FIGS. 1a-1e are schematic cross-sections of a substrate that illustrate steps of a conventional optical lithographic process.

FIGS. 7a-7d show details of substrate and extraction plate geometry for multiple scans at different twist angles of a substrate with respect to an extraction plate, consistent with an embodiment of a PSM system.

FIGS. 9a-9c depict details of multiangular ion treatment of an opening in a resist layer, consistent with the present embodiments.

DESCRIPTION OF EMBODIMENTS

Figure 1I:
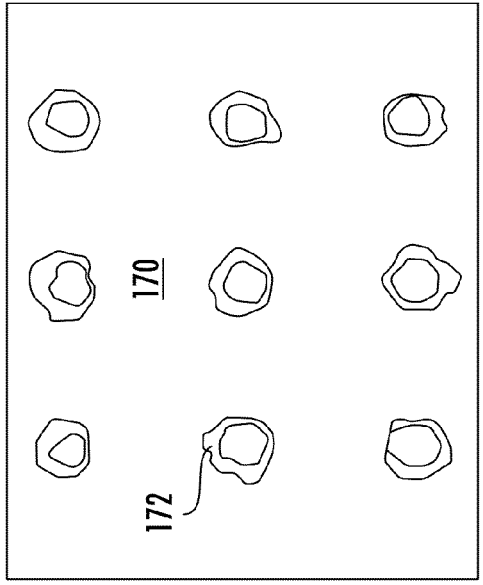
FIG. 1i illustrates another resist layer with conventional patterned openings.
Figure 1F:
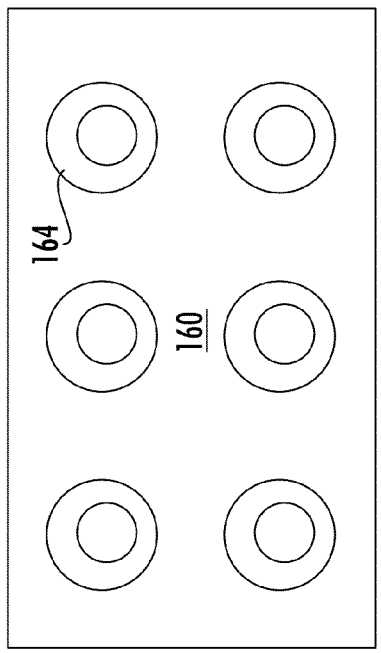
FIGS. 1f and 1g illustrate a top view and side view of a conventional photoresist with patterned openings.
Figure 1G:
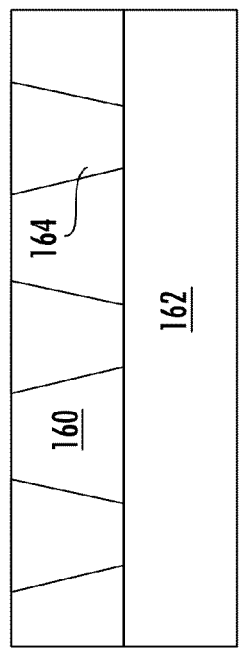
Figure 1H:
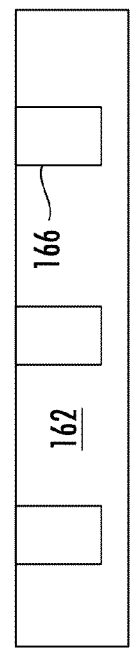
FIG. 1h illustrates a substrate patterned using the patterned resist of FIGS. 1f-1g.
Figure 2:
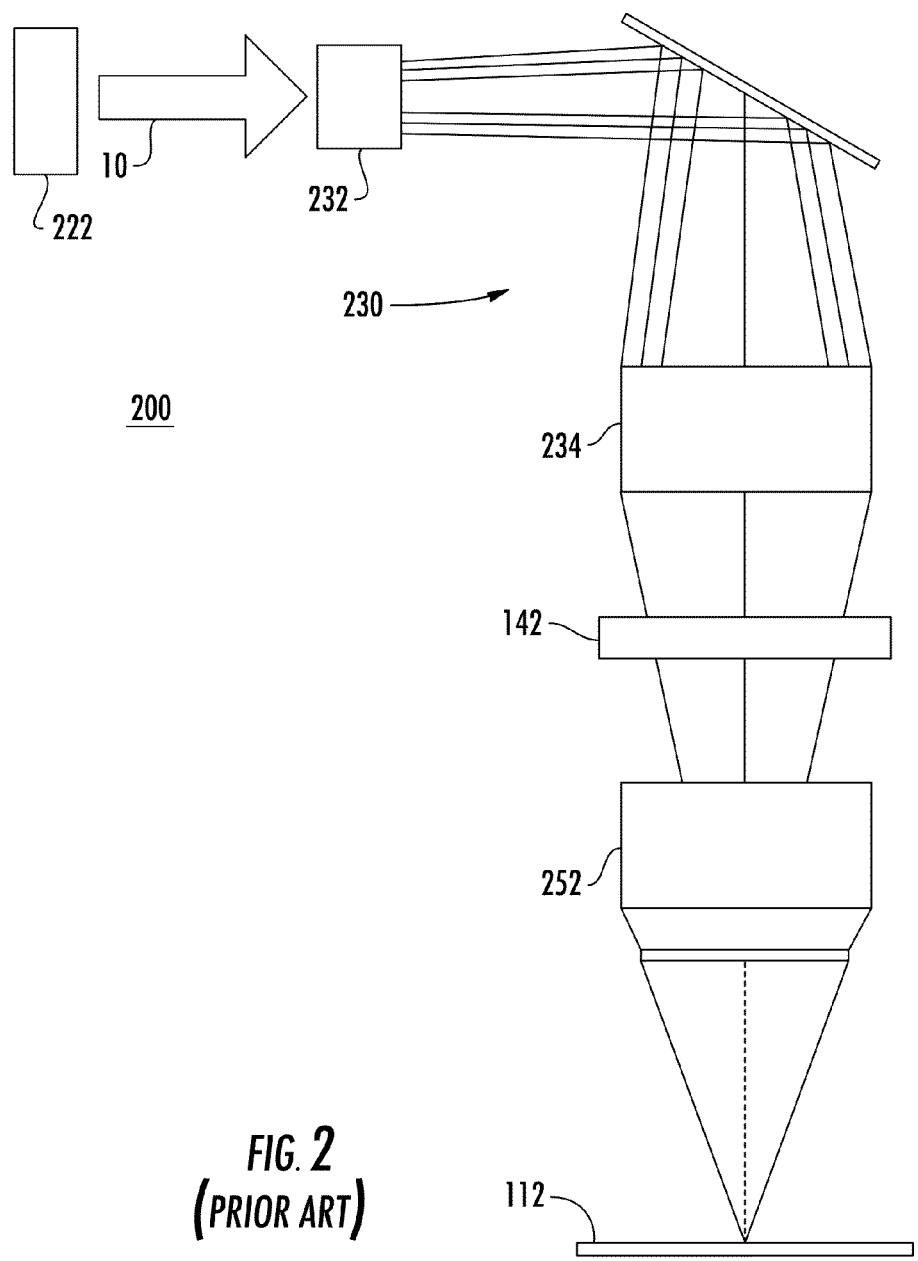
FIG. 2 is a schematic depiction of a conventional optical lithographic system for projecting the image of a mask pattern onto a substrate.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

To solve the deficiencies associated with the methods noted above, novel and inventive techniques and systems for patterning a substrate are introduced. In particular, the present disclosure focuses on techniques involving ion implantation processes for improving the quality of resist openings. The processes disclosed herein may be used in conjunction with processes for forming narrow features, including features that are incorporated into arrays having very small pitch, for example a pitch less than about 250 nm. Such processes include conventional DUV lithography, double patterning lithography, self aligned double patterning lithography, and other lithographic processes. However, those of ordinary skill in the art will recognize that the techniques disclosed herein are not limited to use in conjunction with any particular lithography or any range of resist feature dimensions.

Some embodiments of the invention employ plasma-based systems to treat resist features having very small dimensions. Several embodiments comprising new techniques for processing three dimensional (3D) structures are disclosed. For the purposes of clarity and simplicity, the embodiments are described as techniques for processing photoresist having surfaces oriented at multiple angles. However, those of ordinary skill in the art will recognize that the present disclosure is not limited thereto. The structure may be any type of structure having surfaces oriented at different angles.

The embodiments are also described as techniques using plasma based substrate processing systems. However, those of ordinary skill in the art will recognize that other types of sub-atomic, atomic, or molecular particle based substrate processing systems, including plasma sputtering, as well as beam line ion implantation systems, are within the scope of the present disclosure.

Figure 3A:
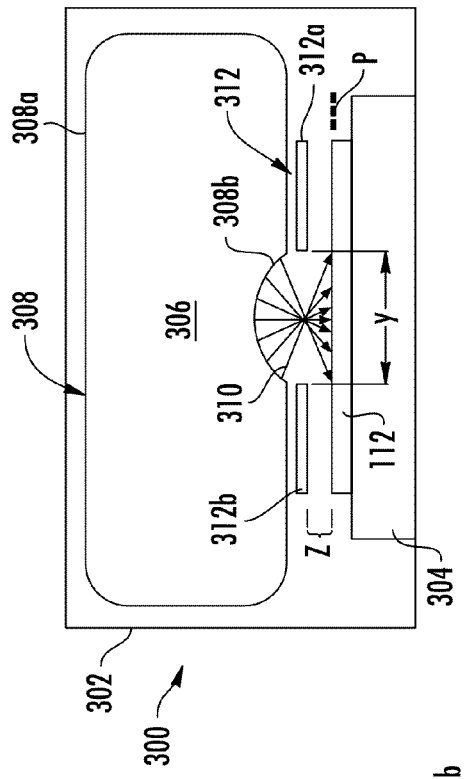
FIG. 3a is a schematic depiction of a processing system, in accordance with one embodiment of the present invention.
Figure 3B:
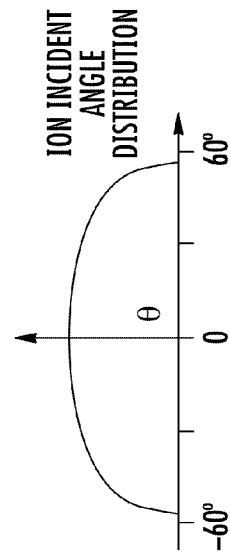
FIG. 3b illustrates an exemplary angular distribution of incident particles on a substrate, as provided by embodiments of the present invention.

Referring to FIG. 3a, there is shown a substrate processing system 300 for processing 3D a structure according to one embodiment of the present invention. FIG. 3b illustrates one type of angular distribution of the particles treating the photoresist. The figures are not necessarily drawn to scale.

As illustrated in FIG. 3a, the system 300 may include a processing chamber 302 in which the substrate 112 and a platen 304 supporting the substrate 112 are disposed. In the present disclosure, the substrate 112 may be a metallic, semi-conducting, or insulating material based substrate. In the present disclosure, patterned photoresist may be disposed on the substrate. The patterned photoresist may be a cured portion of the photoresist remaining on the substrate after an uncured portion is stripped.

The system 300 may also include a plasma source (not shown) for generating plasma 306 contained in the processing chamber 302. The plasma source may be an in situ or remote, inductively coupled plasma source, capacitively coupled plasma source, helicon source, microwave source, or any other type of plasma source. Those of ordinary skill in the art will also recognize that in some instances the platen (substrate holder) 304 may act as the plasma source.

Between the plasma 306 and the substrate 112, one or more plasma sheath modifiers 312 may be disposed. In the present embodiments, the plasma sheath modifier 312 may comprise a pair of modifier parts 312a and 312b spaced apart from one another by a gap "y." In another embodiment, the plasma sheath modifier 312 may comprise a single modifier part. Yet in other embodiments, the plasma sheath modifier 312 may comprise three or more modifier parts spaced apart from one another defining the gap.

The plasma sheath modifier 312 may be capable of adjusting the electric field of the plasma sheath. In some embodiments, the plasma sheath modifier 312 may be positively or negatively charged. The plasma sheath modifier 312 may be made from electrically insulating (e.g. quartz) or conducting (e.g. metallic) material, or a combination thereof. Alternatively, the plasma sheath modifier 312 may be made from semiconducting (e.g. Si) material. If the system 300 includes more than one modifier parts, the parts may be made from the same or different material. For example, the system 300 may include a plasma sheath modifier 312 comprised of two modifier parts 312a and 312b. The modifier parts 312a and 312b may be made from the same material or different materials.

If the plasma sheath modifier 312 comprises two or more parts, the parts may be disposed on the same plane or different planes. For example, the plasma sheath modifier 312 included in the processing system 300 may comprise two modifier parts 312a and 312b and the parts may be disposed in the same plane such that the vertical spacings "z" between the substrate 112 and each modifier part 312a, 312b are the same. In another embodiment, the plasma sheath modifier 312 may comprise two modifier parts 312a and 312b, and each part 312a and 312b may be spaced apart from the substrate 112 by different vertical spacings "z." Additional description of general features of a processing system with the plasma sheath modifier "PSM system") can be found in co-pending U.S. patent application Ser. No. 12/417,929, filed Apr. 3, 2009, and issued as U.S. Pat. No. 7,767,977; Ser. No. 12/418,120, filed Apr. 3, 2010; Ser. No. 12/644,103, filed Dec. 22, 2009; now U.S. Pat. No. 8,101,510, and Ser. No. 12/848,354, filed Aug. 2, 2010, now U.S. Pat. No. 8,188,445 each of which is herein incorporated in its entirety by reference.

The ions 310 in the plasma sheath 308 or the plasma 306 may be directed toward the substrate 112, as the substrate 112 is biased by a DC or RF bias supply (not shown). The bias signal applied to the substrate 112, whether DC or RF, may be continuous or pulsed.

The plasma sheath modifier 312 may modify the shape of the plasma sheath 308 so as to control the incident angle distribution of the ions 310. For example, the plasma sheath modifier 312 may modify the electric field in the plasma sheath 242 and modify the shape of the plasma sheath 308. In the present embodiments, the plasma sheath modifier 312 may modify at least a portion of the sheath 308 into a concave shaped plasma sheath portion (shown as modified sheath portion 308b) relative to the plasma 306, or a dome shaped (convex) plasma relative to the plasma 306. Compared to the substrate 112, the shape of the modified sheath portion 308b may be non-parallel relative to the plane defined by the substrate 112. When the substrate 112 is biased, the ions 310 attracted toward the substrate 112 may travel through the gap "y" between the modifier parts 312a and 312b at a large range of incident angles. In the conventional plasma based processing systems, the plasma sheath closest to the substrate lies parallel to the substrate. When the substrate is biased, the ions travel in a path substantially perpendicular to the plasma sheath, thus substantially perpendicular to the substrate. As a result, the ions in the conventional plasma processing system have incident angles ranging from −5° to +5°, and typically have incident angles close to zero degrees. In the present embodiments, however, the incident angle of the ions 310 may be modified with the modified sheath portion 308b. As illustrated in FIG. 3a, the modified sheath portion 308b is multi-angled relative to the substrate. As such, ions 310 traveling perpendicular to the modified sheath portion 308b may travel in multiple angles, which may span a range larger than −5° to +5°. The ions 310 traveling toward the substrate 112 from different portions of the modified sheath portion 308b may have different incident angles, and the ions 310 may therefore have a large range of incident angles. As illustrated in FIG. 3b, the incident angles θ of the ions 310 may range between about +60° to about −60°, centered about 0° with respect to a plane of the substrate P. In some embodiments, the incident angles of the ions 310 may additionally be modified by the electric field generated by the plasma sheath modifier 312.

Depending on a number of factors including, but not limited to, configurations and properties of the plasma sheath modifier 312, the incident angle of the ions may be additionally modified. Example of such factors may include the horizontal spacing (Y) between the modifier parts 312a and 312b, the vertical spacing (Z) between the plasma sheath modifier 312 and the substrate 112, difference in the vertical spacing (z) between the substrate 112 and each modifier parts 312a and 312b (not shown), and the electrical properties of the plasma sheath modifier 312. Other plasma process parameters may also be adjusted to adjust the incident angle and/or incident angle distribution of the ions. Additional description may be found in the co-pending U.S. patent application Ser. No. 12/418,120, 12/417,929, 12/644,103, and 12/848,354, each of which application, as noted above, is incorporated in its entirety by reference.

By modifying the plasma sheath 308, a three dimensional structure with surfaces oriented at different angles may be treated conformally or isotropically. As noted below, the modified sheath portion 308b may be used to treat multiple surfaces of 3D structures such as, for example, openings in resist layers, at the same time.

Figure 4:
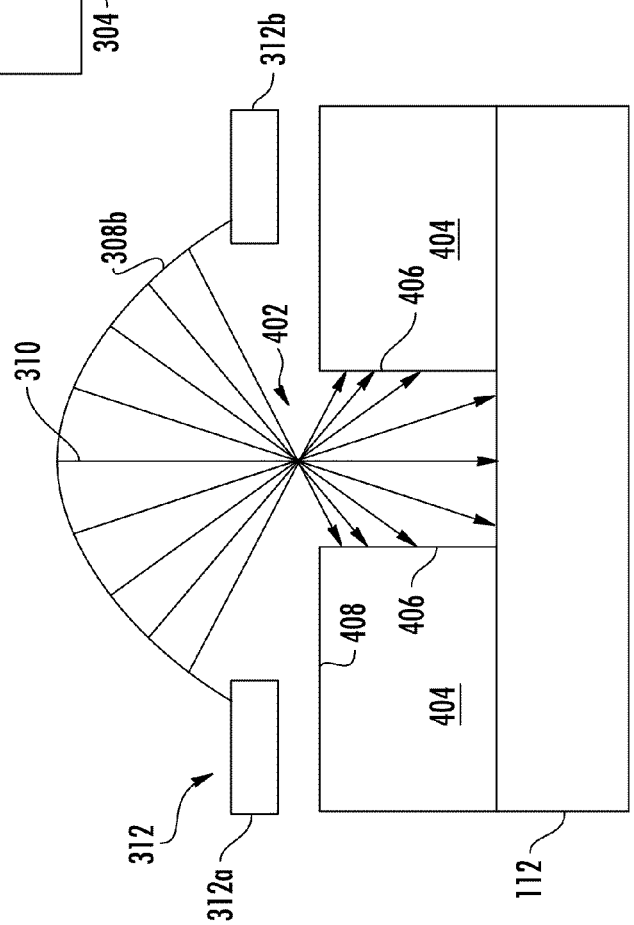
FIG. 4 depicts a schematic cross section of a plasma sheath modifier and a resist feature that illustrate exemplary features of the invention.

Referring to FIG. 4, there is shown a technique for processing 3D structures according to one embodiment of the present invention. In the present embodiments, the technique may be used to reduce LER and LWR contained in 3D photoresist features including an opening 402 in a resist layer 404 that is disposed on substrate 112. As noted above, LER and LWR may occur in opening 402 during optical lithography, after uncured portion of the photoresist resist is removed. In the present embodiments, LER and LWR contained in the photoresist relief 114c may be reduced by performing a process in which ions from plasma 306 are extracted using the plasma sheath modifier 312 and impinge at multiple angles on opening 402, as illustrated. Those of ordinary skill in the art will recognize that the figure is not necessarily drawn to scale.

As illustrated in FIG. 4, the ions 310 in the plasma 306 may be directed through the gap between the plasma sheath modifier parts 312a and 312b at multiple incident angles toward the surfaces of the opening 402, and in particular may impinge on sidewalls 406.

In various embodiments, the ions 310 may be implanted into the resist top surface 408 (ions 310 are not shown striking top surface 408 in the FIGs.) as wells as sidewalls 406. Although various ion species may be implanted, helium (He) or argon (Ar) ions may be implanted in particular. Although the duration of exposure of the resist to ions may cover a wide range, the exposure time may vary from about one second to several minutes. In various embodiments, the ion energy may be about 200 eV to about 5 keV and the total dose of ions directed to a resist may be about 1E14 to 1E16.

In accordance with various embodiments, a plasma sheath modifier may be implemented using a plate (hereinafter termed "extraction plate") that has one or more apertures through which ions are extracted from a plasma so as to impinge on a substrate surface over a range of angles, as described above with respect to FIGS. 3a-3b. As detailed below, in some embodiments, the apertures may be configured as narrow slots, circular holes, chevrons, or arcuate shapes.

Figure 5A:
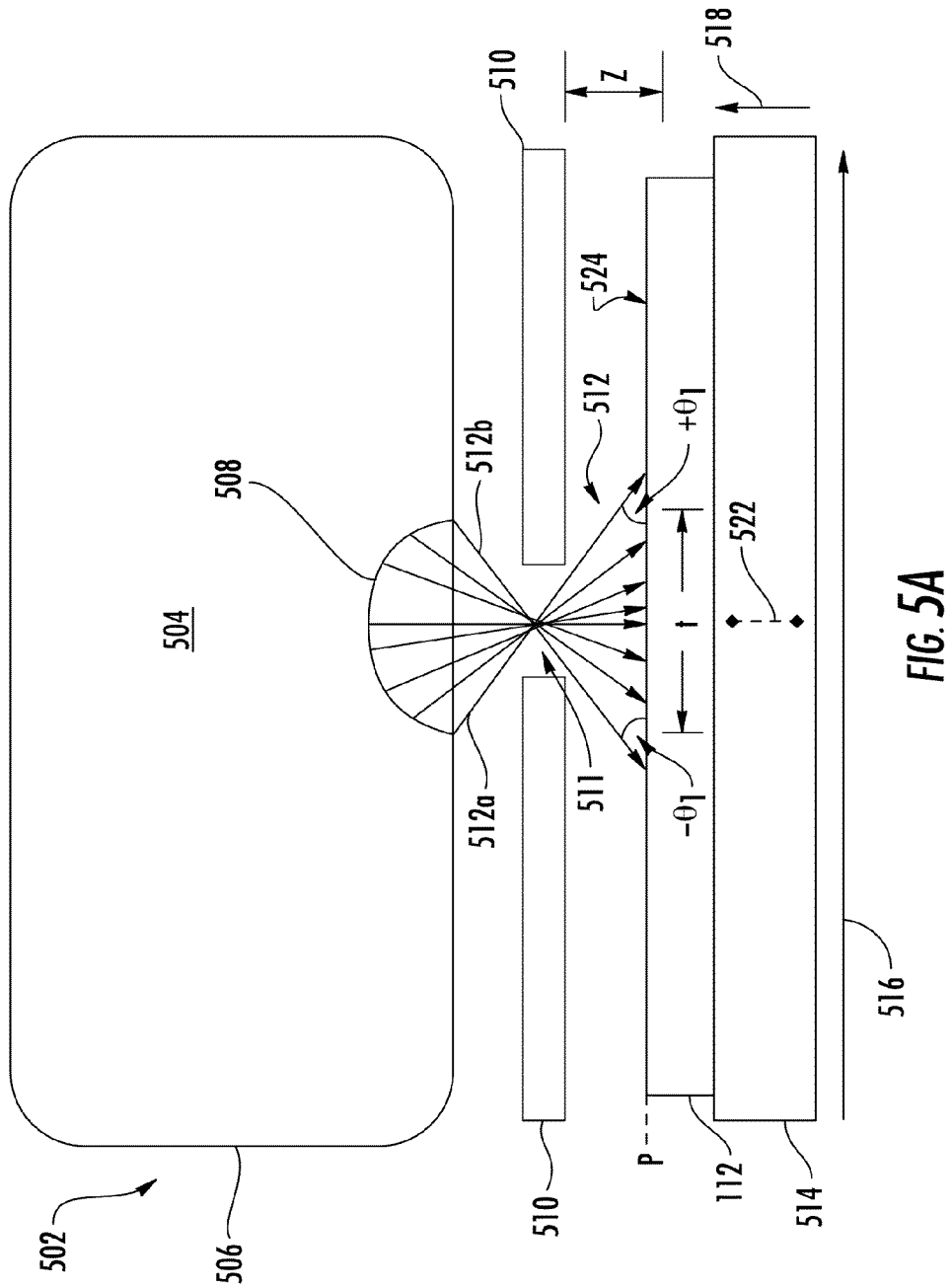
FIGS. 5a and 5b depict details of an exemplary plasma sheath modifier (PSM) system in side view and top view, respectively.
Figure 5B:
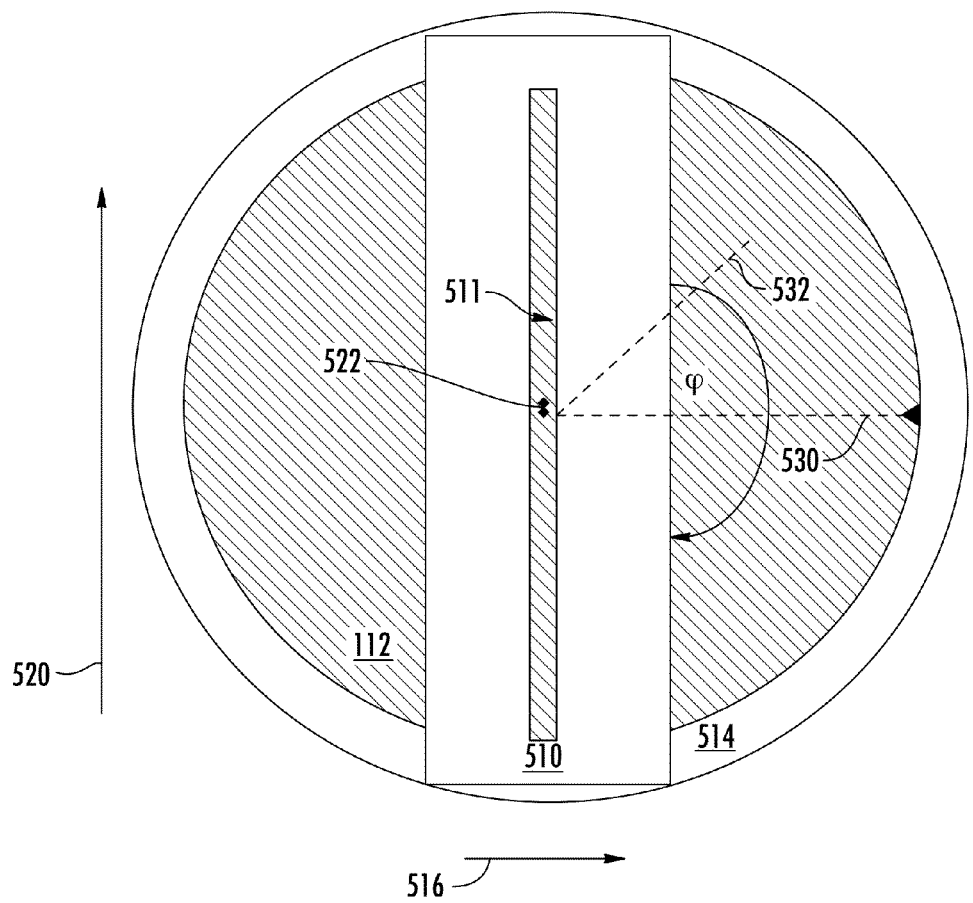

In some embodiments of a PSM system, an extraction plate and substrate holder may be configured for mutual movement with respect to one another in one or more directions. FIGS. 5a and 5b depict details of an exemplary PSM system 502. A plasma 504 is formed adjacent an extraction plate 510, which modifies a plasma sheath boundary 506, forming the curved sheath boundary portion 508, from which ions 512 are extracted through extraction plate aperture 511 and impinge upon substrate 112 over a range of angles. The ions 512 may be extracted when a voltage is applied between the plasma and substrate holder 514.

As further shown in FIG. 5, substrate holder 514 may be configured to move along direction 516 with respect to extraction plate 510. This may be accomplished by use of a movable stage or drive (not shown) attached to either substrate holder 514 or extraction plate 510 (or both). In some embodiments, the substrate holder 514 and extraction plate may also be mutually moved with respect to one another along direction 518, which may be orthogonal to direction 516, thereby changing the separation Z. Turning now to FIG. 5b, a top view of extraction plate 510 is illustrated in relation to substrate 112 and substrate holder 514. In various embodiments, the extraction plate 510 may also be moved with respect to substrate holder 514 along direction 520, which may be orthogonal to both directions 516 and 518. In addition, in various embodiments the extraction plate 510 and substrate holder may be mutually rotated with respect to one another through an angle θ about an axis 522. The axis 522 may form a normal to a plane defined by the top surface 524 of substrate 112. The angle θ may be referred to herein as a "twist angle" and may be defined from the point of view of FIG. 5b. More particularly, the twist angle may be the angle formed between the trajectory of an ion and a plane that is normal to the plane defined by the top surface 524. Such a plane is normal to the stop surface 524 if the plane intersects the normal (axis 522) and a line that lies in the top surface 524, such as line 530. Thus, with respect to the plane defined by line 530 and axis 522, line 530 may be said to form a zero twist angle, and line (trajectory) 532 may be said to form a 45 degree twist angle.

Figure 6:
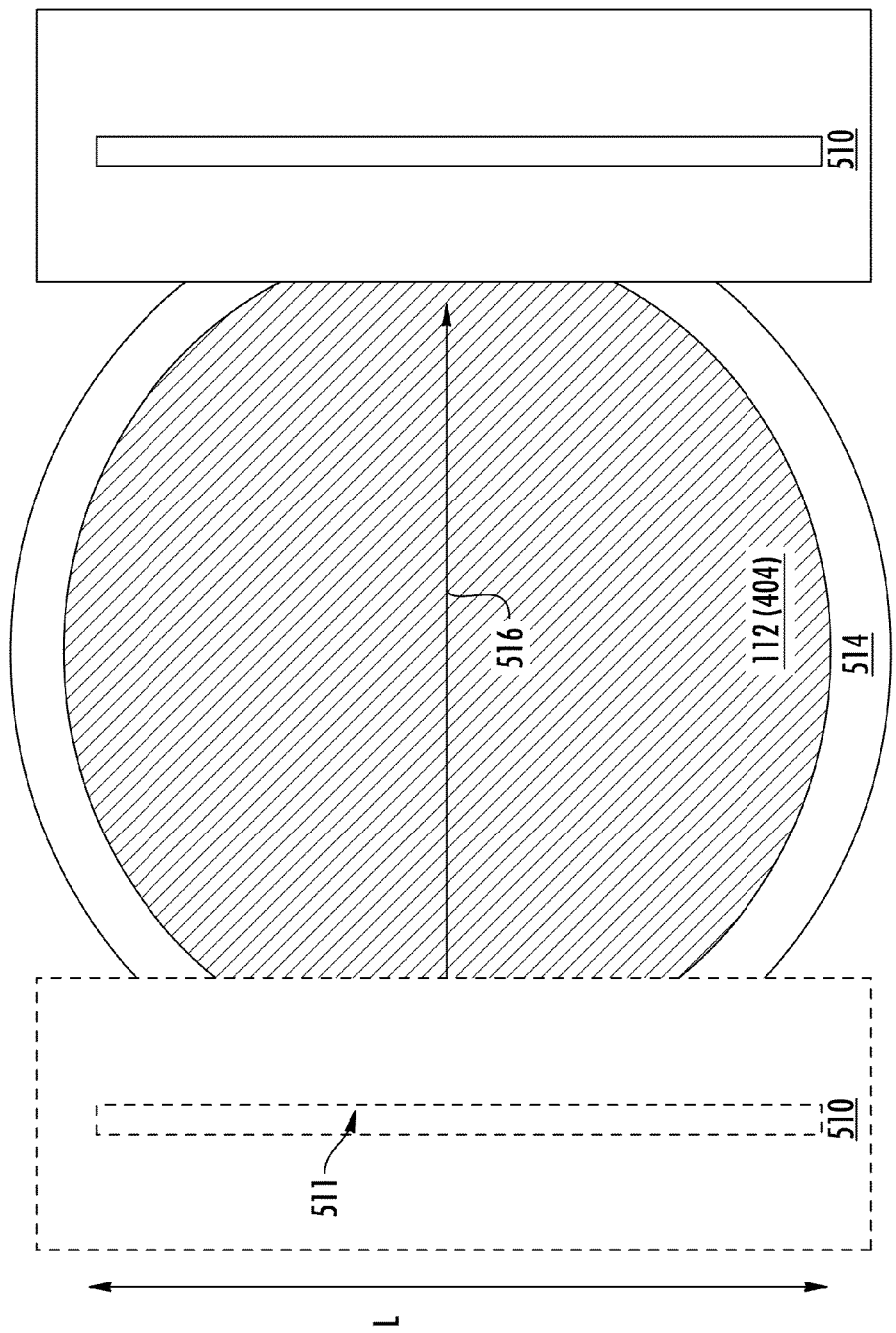
FIG. 6 depicts scanning of the PSM system of FIG. 5.

Consistent with various embodiments, the LWR and LER in resist openings may be improved by controlling one or more of parameters associated with a PSM system. In some embodiments, an extraction plate 510 may be scanned in a single direction with respect to a substrate 112, while a plasma 504 is present. In this manner, an entire substrate 112 may be exposed to ions during a scan, as illustrated in FIG. 6. In the example shown in FIG. 6, the extraction plate 510 and substrate 112 are mutually moved with respect to one another along the direction 516. The length L of the extraction plate aperture 511 is sufficient to provide ions (not shown) across an entire diameter of the substrate 112, such that the entire substrate may be exposed to ions as the scanning takes place.

In additional embodiments, multiple scans may be performed in which the twist angle varies between scans. Referring now to FIG. 7, there are shown details of geometry for multiple scans at different twist angles of a substrate with respect to an extraction plate, consistent with the present embodiments. The scan direction (coincident with direction 516) is perpendicular to the long direction of extraction plate aperture 511 of extraction plate 510. For different scans, a notch 526 of the substrate 112 may be rotated at different angles φ (as defined in FIG. 5b) with respect to the direction 516. Thus, referring to FIG. 7a, the notch 526 is disposed at a twist angle φ of 45 degrees with respect to direction 516. At FIGS. 7b, 7c, and 7d, the notch 526 is disposed at respective twist angles φ of 135, 225, and 315 degrees with respect to direction 516.

Experiments were conducted to study the effect on LWR/LER of resist openings by exposure to ions using a PSM system arranged generally in accordance with the embodiments outlined in FIGS. 3-7. In certain experiments, substrates having patterned resist layers were scanned with respect to an extraction plate having a single linear slot aperture (as generally shown in FIGS. 3-6) to provide exposure to many resist openings disposed in various regions across the substrates.

Figure 8:
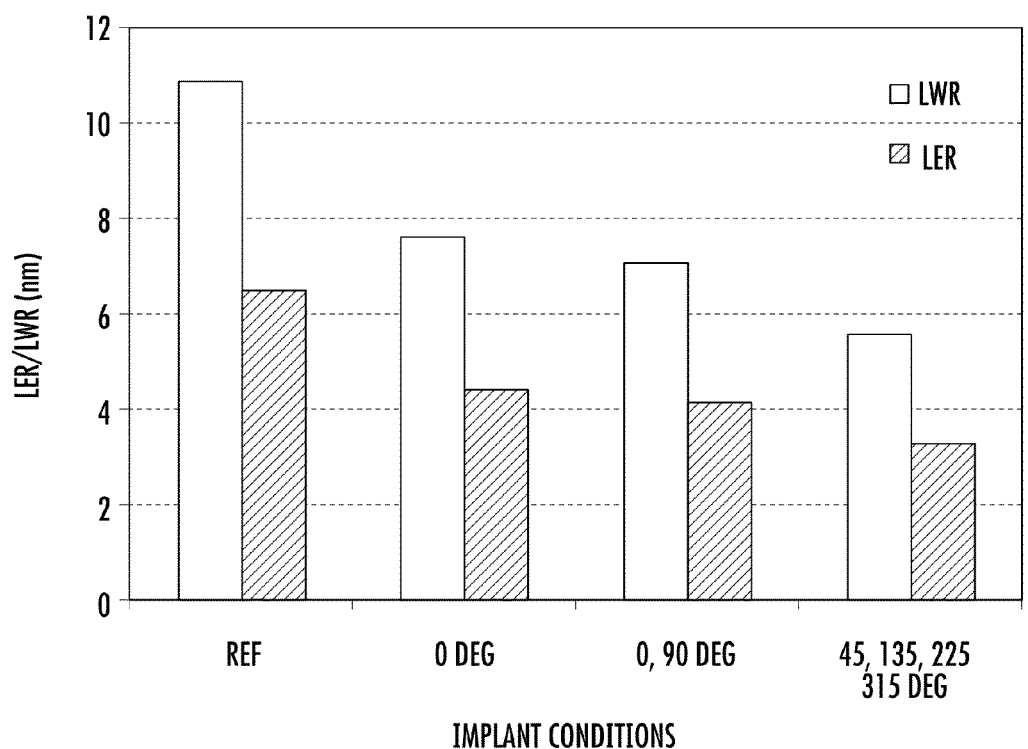
FIG. 8 is a graph illustrating roughness measurements of patterned resist samples subjected to a conventional treatment and subjected to various treatments consistent with the present embodiments.

FIG. 8 is a graph illustrating roughness measurements of resist openings of patterned resist samples subjected to various treatments. The patterned resist samples include two dimensional arrays of generally circularly shaped openings (vias) of 200 nm nominal diameter of 400 nm pitch that were developed after lithographic exposure to form vias extending through the resist. The roughness of the circularly shaped features at the top of the resist was measured using an image processing program that treated micrographic images of the resist samples. A control sample was measured that was subjected to lithographic processes to form arrays of resist openings, but was not provided exposure to ions after formation of the resist openings. In various other experiments, after lithographic formation of resist openings, the resist samples were exposed to argon ions extracted through an extraction plate while the substrate was scanned with respect to the extraction plate.

In particular, in FIG. 8 LWR/LER results are depicted for three different recipes used to expose the arrays of resist openings to ions (termed "implant conditions" in the figure) using an extraction plate consistent with the present embodiments. The "O deg" results refer to measurements performed on patterned resist openings after being subjected to scans where the notch is oriented at a twist angle of zero degrees during each scan. The "O, 90 deg" results refer to measurements performed on patterned resist openings after being subjected to two different set of scans: the first scan set occurs at a zero degrees twist angle and the second scan set occurs at a ninety degree twist angle. The "45, 135, 225, 315 deg" results refer to measurements performed on patterned resist openings after being subjected to four different set of scans: the first scan set occurs at a 45 degrees twist angle (see FIG. 7a), the second scan set occurs at a 135 degree twist angle (see FIG. 7b), the third scan set occurs at a 225 degree twist angle (see FIG. 7c), and the fourth scan set occurs at a 315 degree twist angle (see FIG. 7d).

As is evident, the LWR/LER improves for all ion exposure conditions as compared to the control sample. For example, the "O deg" results show an improvement from about 11 nm to about 7.5 nm in LWR and an improvement in LER from about 6.5 to about 4.5 nm. Moreover, the procedures with multiple scan orientations ("0, 90 deg" and "45, 135, 225, 315 deg") show further improvement with respect to "0 deg"

results. In particular, the greatest LWR/LER improvements are produced using the procedure having four different orientations: "45, 135, 225, 315 deg."

These results can be understood by reference to FIGS. 9a-9c, which depict a sequence of multiangular ion treatment of an opening 402 in resist layer 404 at different twist angles, consistent with the present embodiments. An extraction plate aperture 511 is disposed over the opening 402 in the top view illustrated. Ions 512a, 512b (see FIG. 5) are extracted through extraction plate aperture 511 and impinge upon the resist opening 402 from opposite sides of the extraction plate aperture 511. In the view of FIG. 9a, the projection of trajectories of ions 512a, 512b (which form respective angles $-\theta_1$ and $+\theta_1$ with respect to substrate plane P) is illustrated. The scenario of FIG. 9a may represent the resist layer 404 at an initial stage of exposure to ions 512 in which the opening 402 is rough. The trajectories of ions 512a and 512b is such that the ions may tend to strike portions of opening 402 more directly between points e and f, as well as between g and h. Portions of the opening that lie between points f and g or between e and h, on the other hand, may be struck by the ions at a more glancing incidence angle. At FIG. 9b, the substrate supporting resist layer 404 is rotated ninety degrees with respect to the orientation shown in FIG. 9a. In this latter case, the trajectories of ions 512a and 512b is such that the ions may tend to strike portions of opening 402 more directly between points e and h, as well as between g and f. Portions of the opening that lie between points e and f or between g and h (which are already smoother based on treatment received in FIG. 9a), on the other hand, may be struck by the ions at a more glancing incidence angle. Afterwards, as depicted in FIG. 9c, all regions of opening 402 are smoother. In this manner, by providing ions whose trajectories define two different twist angles with respect to an opening 402, the ions provide a more uniform treatment of the opening 402 in comparison to using a fixed rotational position.

It is to be emphasized that the results of FIG. 8 are merely exemplary and improvements in LWR/LER can be expected using the present embodiments for a range of nominal opening sizes. This improvement may be critical in devices requiring contacts having nominal diameters below 100 nm, in which the 11 nm LWR produced in the reference process may be too excessive to meet device performance uniformity or reliability requirements.

Figures 10A, 10B, 10C:
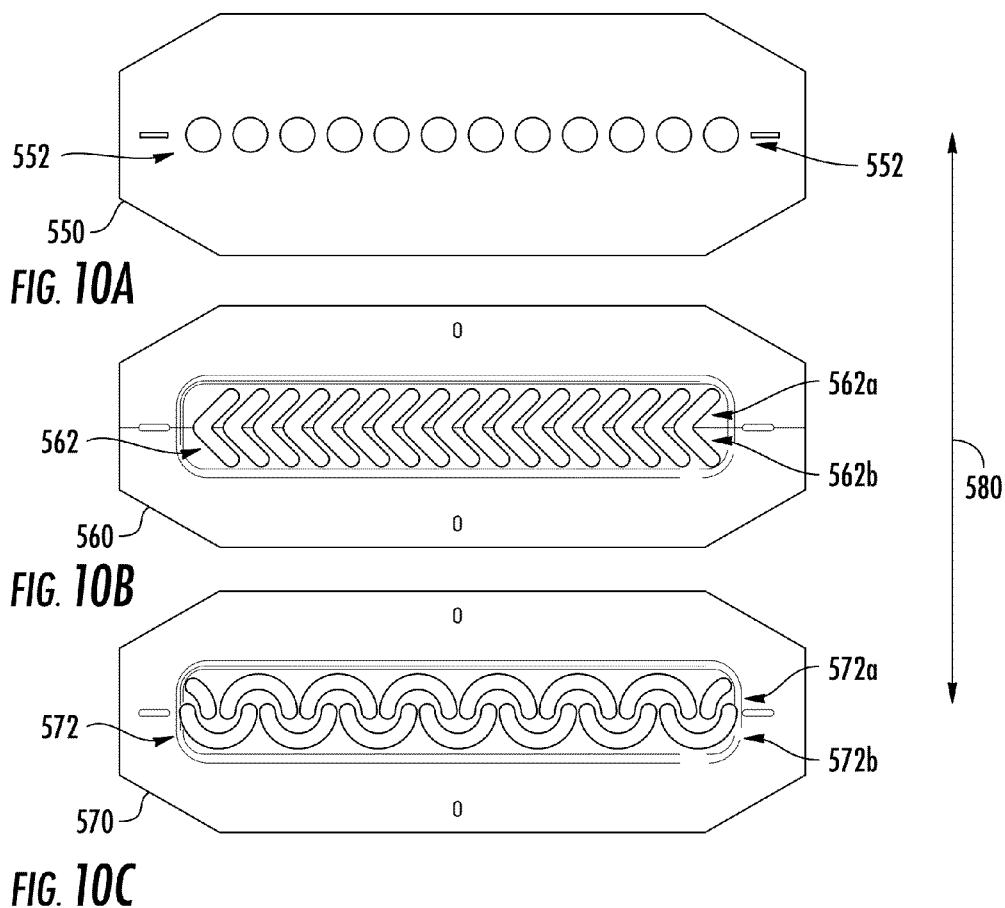
FIGS. 10a-10c depict exemplary extraction plates consistent with further embodiments.

In other embodiments, the apertures in an extraction plate may have curved or angled shapes. By providing curved or angled aperture shapes, ions may be extracted and provided to a substrate having trajectories defined by multiple twist angles $\phi$ without requiring rotation of the extraction plate with respect to the substrate. FIGS. 10a-10c depict exemplary extraction plates 550, 560, and 570 consistent with further embodiments. The extraction plate 550 includes a linear array of circular apertures 552. Ions extracted through the circular apertures 552 may simultaneously strike a substrate over a continuous 360 degree range of twist angles $\phi$. FIG. 10b depicts an extraction plate 560 that includes a linear array of chevron-shaped apertures 562. The chevron-shaped apertures 562 define an approximate 90 degree angle between upper branches 562a and lower branches 562b. Ions extracted through the chevron-shaped apertures 562 may therefore simultaneously strike a substrate at four twist angles $\phi$ that are arranged at about 45, 135, 225, and 315 degrees with respect to a direction 580, as illustrated. FIG. 10c depicts an extraction plate 570 that includes a linear array of arcuate apertures 572, where each aperture describes an approximately semicircular arc. In the embodiment depicted, the arcuate apertures 572 alternate in their orientation from curving in a first direction (see 572a) to curving in an opposite direction (see 572b) along a line perpendicular to the direction 580. However, each aperture may provide a continuous range continuous 360 degree range of twist angles $\phi$ similarly to the circular apertures 52.

Figure 10D:
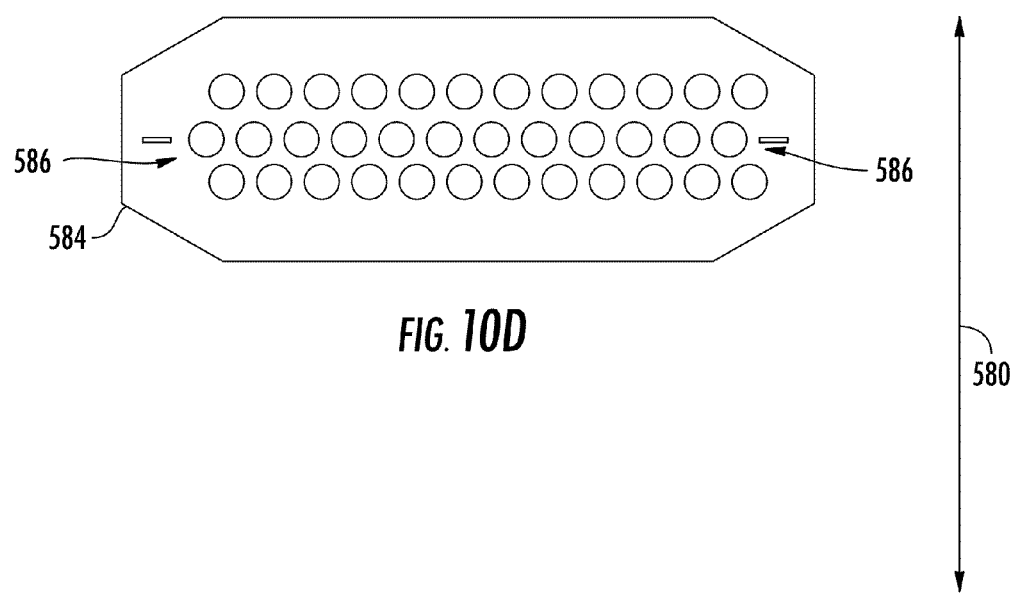
FIG. 10d depicts an extraction plate that includes multiple rows of circular apertures.

FIG. 10d depicts an extraction plate 584 that includes multiple rows of circular apertures 586. As with extraction plate 550, ions extracted through the circular apertures 586 may simultaneously strike a substrate over a continuous 360 degree range of twist angles $\phi$.

In operation, the extraction plates 550, 560, 570, and 584 may be scanned in the direction 580 with respect to a substrate while ions are extracted through the respective extraction plates towards a substrate. In this manner, ions simultaneously impinge upon a resist feature, such as a resist opening, over a range of twist angles $\phi$ as well as multiple angles $\theta$ 360 with respect to the substrate plane P, which may result in more effective smoothening of the opening. In additional embodiments, the any of the extraction plates 550, 560, 570, and 584 may be scanned in a series of scans in which the rotational position of a substrate 112 is different between different scans, as described above with respect to FIGS. 9a-9c. This may provide an extra degree of uniformity by varying the twist angles $\phi$ not only within a given scan by the nature of the apertures in extraction plates 550, 560, and 570, but also by varying the twist angles $\phi$ between scans.

Although the aforementioned embodiments provide ions to improve roughness in openings in resist layers, in further embodiments, the average size of the openings may also be controlled. As noted above, conventional lithography is limited because of the inability to image very small features in resist, such as circular features used to produce openings for vias in a substrate. Accordingly, it may be desirable to use a conventional lithographic process to produce an opening of a relatively larger lateral size (a relatively larger diameter in the case of a circular opening) and then to subsequently treat the resist opening to shrink the opening to a relatively smaller lateral size.

Consistent with further embodiments, a PSM system may be used to reduce opening size in patterned resist layers. In one implementation, a relatively higher ion dose rate may be extracted through an extraction plate and used to shrink the lateral dimension of openings in a resist layer by swelling the resist that surrounds each opening. In copending patent application U.S. Ser. No. 13/099,432 filed May 3, 2011, now U.S. Pat. No. 8,354,655, and incorporated by reference herein in its entirety, it was disclosed that a PSM system employing a 500 W rf plasma power in a pulsed plasma mode is effective in increasing linewidth (CD) of narrow resist lines by about 10 nm. Accordingly, resist openings such as circular openings, may be expected to shrink in diameter using similar exposure to ions. In some embodiments, multiple ion treatments may be provided to a patterned resist layer having one or more openings. The multiple ion treatments may include independent treatments for reducing roughness and for reducing size of the opening.

Figure 11:
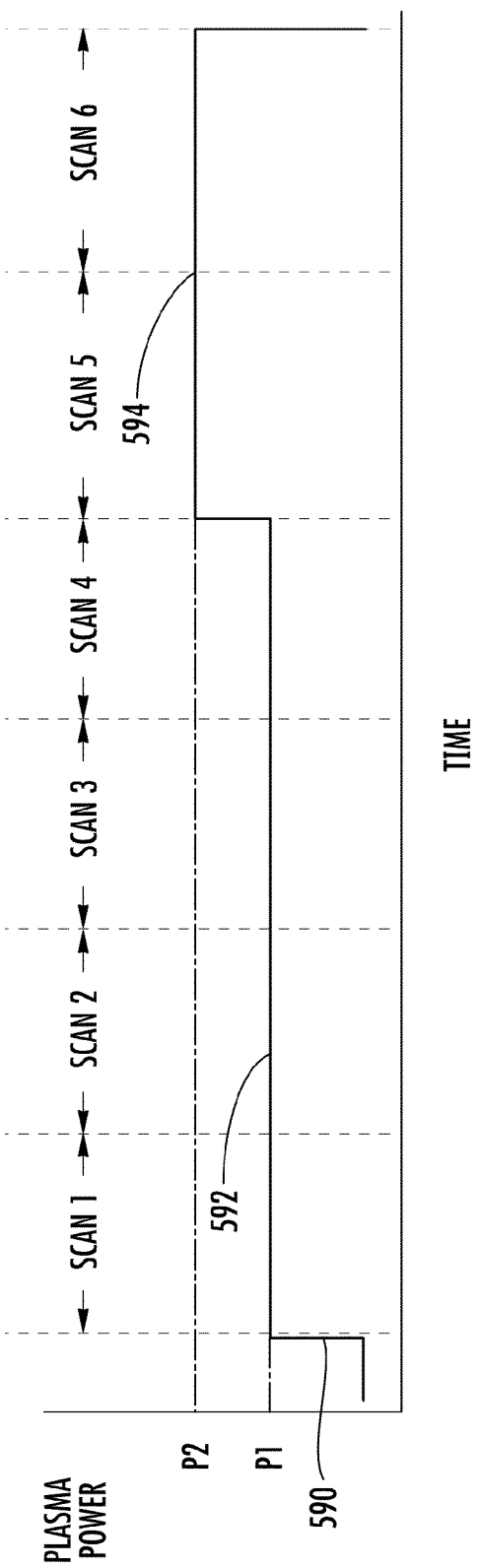
FIG. 11 depicts aspects of a method for treating a resist layer consistent with further embodiments.

FIG. 11 depicts aspects of a method for treating a resist layer consistent with further embodiments. In FIG. 11, a plasma power curve 590 is illustrated that may be used to control power in a PSM system containing an extraction plate for directing ions to resist openings. During a first portion of the plasma power curve 590, the plasma power is set at a relatively lower setting. During this first portion 592, a series of scans (scan1, scan2, scan3, scan4) may be performed to expose the substrate to ions at multiple angles. The rotational angle of the extraction plate with respect to the substrate may be varied between the different scans to change the twist angle and thereby improve the resist opening roughness, as described above. During a subsequent portion 594 of the plasma power curve 590, the plasma power level is raised in order to swell the resist and thereby decrease the size of the smoothened resist openings. The rotational angle may be the same or may be varied between the scan5 and scan6.

It is to be noted that the treatment of resist openings with multiple angled ions may improve other aspects of the resist openings. For example, resist residue at the bottom of resist openings near the substrate may be removed more effectively because the multiple range of angles of incidence of ions may ensure that at least some portion of the ions have the proper trajectory to impinge upon the bottom of resist openings.

The methods described herein may be automated by, for example, tangibly embodying a program of instructions upon a computer readable storage media capable of being read by machine capable of executing the instructions. A general purpose computer is one example of such a machine. A non-limiting exemplary list of appropriate storage media well known in the art includes such devices as a readable or write-able CD, flash memory chips (e.g., thumb drives), various magnetic storage media, and the like.

The present invention is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the subject matter of the present disclosure should be construed in view of the full breadth and spirit of the present disclosure as described herein.

What is claimed is:

1. A method of reducing roughness in an opening in a resist material disposed on a substrate, comprising:
   generating a plasma having a plasma sheath and ions therein;
   modifying a shape of a boundary defined between the plasma and the plasma sheath with a plasma sheath modifier so that a portion of the boundary facing the resist material is not parallel to a plane defined by a surface of the substrate;
   providing a first exposure of ions while the substrate is in a first position, the first exposure comprising ions accelerated across the boundary having the modified shape toward the resist material over an angular range with respect to the surface of the substrate; and
   providing one or more exposure cycles after the first exposure, each exposure cycle comprising:
      rotating the extraction plate with respect to the substrate through a twist angle about a normal to the surface of the substrate from a previous position to a new position; and
      providing an additional exposure while the substrate is in the new position, the additional exposure comprising ions accelerated across the boundary having the modified shape toward the resist material over an angular range with respect to the surface of the resist material.

2. The method of claim 1, wherein modifying the shape of the boundary comprises providing an extraction plate that contains at least one aperture, and wherein a shape of the boundary about the gap is convex relative to the plane.

3. The method of claim 1, wherein the angular range is between about positive 60° to about negative 60° centered about an axis perpendicular to the plane.

4. The method of claim 1, wherein the one or more exposure cycles comprises three exposure cycles, and wherein the twist angle is ninety degrees.

5. The method of claim 1, wherein the ions comprise an inert gas.

6. The method of claim 2, wherein the at least one aperture is configured to provide ions simultaneously over a range of twist angles about a normal to the surface of the substrate.

7. The method of claim 6, wherein the at least one aperture comprises one of: a chevron shape, an arcuate shape, and a circular shape.

8. The method of claim 2, further comprising scanning the extraction plate during the first exposure.

9. A method of treating an opening in a resist material disposed on a substrate, comprising:
   providing a first dose of ions over a range of angles of incidence with respective to a surface of the substrate, wherein the first dose is effective in reducing roughness of the opening in the resist material,
   wherein modifying the shape of the boundary comprises providing an extraction plate that contains at least one aperture, and wherein a shape of the boundary about the gap is convex relative to the plane, the method further comprising scanning the extraction plate during the providing the first dose.

10. The method of claim 9, wherein the providing the ions comprises:
   generating a plasma having a plasma sheath and ions therein;
   modifying a shape of a boundary defined between the plasma and the plasma sheath with a plasma sheath modifier so that a portion of the boundary facing the resist material is not parallel to a plane defined by the surface of the substrate; and
   accelerating the ions across the boundary having the modified shape toward the resist material over a range of angles with respect to the surface of the substrate.

11. The method of claim 9, wherein the providing the ions comprises providing the first dose of ions at a first twist angle and a second dose of ions at a second twist angle.

12. A method of reducing roughness in an opening in a resist material disposed on a substrate, comprising:
   generating a plasma having a plasma sheath and ions therein;
   modifying a shape of a boundary defined between the plasma and the plasma sheath with a plasma sheath modifier so that a portion of the boundary facing the resist material is not parallel to a plane defined by a surface of the substrate;
   providing a first exposure of ions while the substrate is in a first position, the first exposure comprising ions accelerated across the boundary having the modified shape toward the resist material over an angular range with respect to the surface of the substrate; and
   providing, after the first exposure, a second exposure of ions at an ion dose rate configured to swell the resist.

13. The method of claim 12, wherein modifying the shape of the boundary comprises providing an extraction plate that contains at least one aperture, and wherein a shape of the boundary about the gap is convex relative to the plane, the method further comprising scanning the extraction plate during the first exposure.

14. A method of reducing roughness in an opening in a resist material disposed on a substrate, comprising:
  generating a plasma having a plasma sheath and ions therein;
  modifying a shape of a boundary defined between the plasma and the plasma sheath with a plasma sheath modifier so that a portion of the boundary facing the resist material is not parallel to a plane defined by a surface of the substrate; and
  providing a first exposure of ions while the substrate is in a first position, the first exposure comprising ions accelerated across the boundary having the modified shape toward the resist material over an angular range with respect to the surface of the substrate,
  wherein modifying the shape of the boundary comprises providing an extraction plate that contains at least one aperture,
  wherein a shape of the boundary about the gap is convex relative to the plane, and
  wherein the at least one aperture is configured to provide ions simultaneously over a range of twist angles about a normal to the surface of the substrate.

15. The method of claim 14, wherein the at least one aperture comprises one of: a chevron shape, an arcuate shape, and a circular shape.

* * * * *